United States Patent
Tamura et al.

(10) Patent No.: US 10,048,585 B2
(45) Date of Patent: Aug. 14, 2018

(54) RESIN COMPOSITION, METHOD FOR FORMING PATTERN USING THE SAME, AND METHOD FOR SYNTHESIZING POLYMER

(71) Applicant: NISSAN CHEMICAL INDUSTRIES, LTD., Tokyo (JP)

(72) Inventors: Mamoru Tamura, Toyama (JP); Tomoyuki Enomoto, Toyama (JP)

(73) Assignee: NISSAN CHEMICAL INDUSTRIES, LTD., Tokyo (JP)

( * ) Notice: Subject to any disclaimer, the term of this patent is extended or adjusted under 35 U.S.C. 154(b) by 0 days.

(21) Appl. No.: 15/563,752

(22) PCT Filed: Mar. 9, 2016

(86) PCT No.: PCT/JP2016/057426
§ 371 (c)(1),
(2) Date: Oct. 2, 2017

(87) PCT Pub. No.: WO2016/158271
PCT Pub. Date: Oct. 6, 2016

(65) Prior Publication Data
US 2018/0081273 A1 Mar. 22, 2018

(30) Foreign Application Priority Data
Mar. 30, 2015 (JP) ................. 2015-069956

(51) Int. Cl.
| | | |
|---|---|---|
| *G03F 7/11* | (2006.01) |
| *C08G 65/40* | (2006.01) |
| *C09D 171/00* | (2006.01) |
| *G03F 7/038* | (2006.01) |
| *G03F 7/039* | (2006.01) |
| *G03F 7/40* | (2006.01) |
| *G03F 7/023* | (2006.01) |
| *G03F 7/16* | (2006.01) |
| *G03F 7/20* | (2006.01) |
| *G03F 7/32* | (2006.01) |
| *C08G 65/48* | (2006.01) |
| *G03F 7/075* | (2006.01) |

(52) U.S. Cl.
CPC ........... *G03F 7/0233* (2013.01); *C08G 65/40* (2013.01); *C08G 65/48* (2013.01); *C09D 171/00* (2013.01); *G03F 7/038* (2013.01); *G03F 7/039* (2013.01); *G03F 7/0758* (2013.01); *G03F 7/162* (2013.01); *G03F 7/168* (2013.01); *G03F 7/2006* (2013.01); *G03F 7/322* (2013.01); *G03F 7/325* (2013.01); *G03F 7/40* (2013.01)

(58) Field of Classification Search
CPC ...... C08G 65/48; C08G 65/40; C09D 171/00; G03F 7/0233; G03F 7/0758; G03F 7/038; G03F 7/039; G03F 7/162; G03F 7/168; G03F 7/2006; G03F 7/322; G03F 7/325; G03F 7/40
See application file for complete search history.

(56) References Cited

U.S. PATENT DOCUMENTS

| | | | | |
|---|---|---|---|---|
| 2003/0118940 A1* | 6/2003 | Narang | ............... | B41J 2/14129 430/280.1 |
| 2014/0374887 A1* | 12/2014 | Tamura | .................. | C08G 65/40 257/632 |
| 2017/0253764 A1* | 9/2017 | Tamura | ................ | C09D 175/08 |

FOREIGN PATENT DOCUMENTS

| | | | |
|---|---|---|---|
| JP | 2000-230142 A | | 8/2000 |
| JP | 2004-133088 A | | 4/2004 |
| JP | 2008-224984 A | | 9/2008 |
| JP | 2009-098681 A | | 5/2009 |
| JP | 2009-244801 A | | 10/2009 |
| KR | 10-2011-0065899 A | * | 6/2011 |
| WO | 2013/118871 A1 | | 8/2013 |

OTHER PUBLICATIONS

KR-10-2011-0065889—A obtained from SciFinder database Accession No. 2011:774791, CAN 155:95316, CAPLUS Patent Information: Jun. 16, 2011, KR 2011065889, A, 3 pages.*
Jun. 14, 2016 Written Opinion issued in International Patent Application No. PCT/JP2016/057426.
Jun. 14, 2016 Search Report issued in International Patent Application No. PCT/JP2016/057426.

* cited by examiner

*Primary Examiner* — Cynthia Hamilton
(74) *Attorney, Agent, or Firm* — Oliff PLC

(57) ABSTRACT

A resin composition for forming an insulating film including a polymer having a structural unit of the following formula (1a) and a structural unit of the following formula (1b); and an organic solvent; wherein $T_0$ is a divalent organic group containing at least one arylene group in which at least one hydrogen atom is substituted with an amino group; and $T_1$ is a divalent organic group containing at least one arylene group having at least one substituent, wherein the substituent is a substituent of the following formula (2); and wherein Z is a divalent, aliphatic, aromatic, or alicyclic group optionally having a substituent.

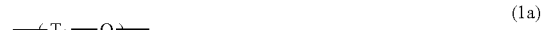

(1a)

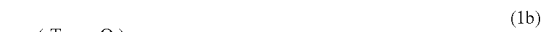

(1b)

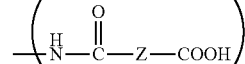

(2)

12 Claims, No Drawings

RESIN COMPOSITION, METHOD FOR FORMING PATTERN USING THE SAME, AND METHOD FOR SYNTHESIZING POLYMER

TECHNICAL FIELD

The present invention relates to a resin composition comprising a novel polymer soluble in an aqueous alkaline solution, a method for forming a pattern using the resin composition, and a method for synthesizing the polymer. In particular, the present invention relates to a resin composition that is suitable, for example, as a surface protective film or an interlayer insulating film in the process for manufacturing semiconductor devices represented by IC chips, and as a planarization film or an interlayer insulating film for displays.

BACKGROUND ART

The recent high performance and compactness of electronic devices such as mobile phones and IC cards require that semiconductor devices be further integrated, have smaller footprints, and have lower interconnection resistance due to a reduction in interconnection distance. To achieve this, a layered structure, i.e., a stacked structure, in which semiconductor devices are vertically stacked, has been studied.

One exemplary method for producing such a stacked structure includes, for example, the steps of bonding a silicon wafer having semiconductor devices formed thereon to a support substrate with an adhesive or the like for temporary bonding, and then thinning a rear surface of the silicon wafer; providing through-holes in the rear surface by the TSV (Through-Silicon Via) technique using a technique such as anisotropic dry etching; filling the through-holes with a conductive material such as copper to form electrodes through the rear surface; forming an insulating film on the rear surface of the silicon wafer having the electrodes formed therethrough; and electrically joining the resulting silicon wafer to another chip or silicon wafer having semiconductor devices formed thereon.

In these steps, the insulating film formed on the rear surface of the silicon wafer is required to have characteristics such as electrical insulating properties for preventing current leakage or migration of the conductive material between electrodes, solvent resistance, and heat resistance in the step of joining the electrodes. The insulating film is also required to exhibit these characteristics at a low temperature, for example, 250° C. or lower, from the viewpoint of the heat resistance of the component.

Known insulating films include insulating films formed by spin coating using polyimides, polybenzoxazoles, aromatic polyethers, and the like. In particular, an insulating film with photosensitivity can be readily formed by applying patterning through irradiation with active light, development, imidization by heating, and the like. Thus, compared to a non-photosensitive insulating film, such a photosensitive insulating film is characterized by a significantly shortened process. On the other hand, the development step of the photosensitive insulating film involves the use of a large amount of an organic solvent as the developing solution. Out of the recently growing concern for environmental issues, there is a demand for measures to eliminate the organic solvent. To meet this demand, a photosensitive resin material has been recently disclosed that it is obtained using a photosensitive polyimide precursor or a photosensitive polybenzoxazole precursor developable with an aqueous alkaline solution, as with photoresists (for example, Patent Document 1).

To exhibit good electrical insulating properties, however, such a photosensitive resin composition obtained using a photosensitive polyimide precursor or a photosensitive polybenzoxazole precursor needs to be baked for a long time at a high temperature, for example, about 350 to 400° C., so that the imidization by cyclodehydration proceeds completely. Thus, the use of the photosensitive resin composition at a low temperature, i.e., about 250° C., has been difficult. To allow the imidization to proceed at a lower temperature, a photosensitive resin composition has been disclosed that it is obtained using a polyimide or polybenzoxazole having an aliphatic chain structure (for example, Patent Document 2). The cyclodehydration reaction can be performed at a lower temperature by adopting the flexible aliphatic structure as the main chain structure, as described in Patent Document 2. It is, however, still difficult for the imidization to proceed completely, because the flexibility of the main chain skeleton decreases as the cyclodehydration reaction proceeds.

Photosensitive resin compositions obtained using aromatic polyethers developable with aqueous alkaline solutions have also been disclosed (for example, Patent Documents 3 and 4). Aromatic polyethers are superior to polyimides and polybenzoxazoles in that they do not need to be baked at high temperature to exhibit electrical insulating properties. The aromatic polyether described in Patent Document 3, however, has an acidic group such as a carboxylic acid to allow dissolution in an aqueous alkaline solution, and the acidic group is contained in the resin even after pattern formation. Thus, the aromatic polyether suffers from insufficient electrical insulating properties. The aromatic polyether described in Patent Document 4 has an amic acid structure as a side chain, and the imidization by cyclodehydration reaction is not affected by the main chain skeleton, which allows the imidization to proceed at low temperature. The aromatic polyether also has high electrical insulating properties. However, because a high temperature is required for the synthesis of the aromatic polyether, the hydrolysis or imidization of amic acid proceeds during the synthesis, which makes it difficult for the aromatic polyether to exhibit high solubility in an aqueous alkaline solution.

PRIOR ART DOCUMENTS

Patent Documents

Patent Document 1: Japanese Patent Application Publication No. 2004-133088 (JP 2004-133088 A)
Patent Document 2: Japanese Patent Application Publication No. 2008-224984 (JP 2008-224984 A)
Patent Document 3: Japanese Patent Application Publication No. 2009-098681 (JP 2009-098681 A)
Patent Document 4: Japanese Patent Application Publication No. 2009-244801 (JP 2009-244801 A)

SUMMARY OF THE INVENTION

Problem to be Solved by the Invention

An object of the present invention is to provide a resin composition comprising a novel polymer that rapidly dissolves in an aqueous alkaline solution, and exhibits excellent electrical insulating properties at a low temperature, i.e., 250° C., a method for forming a pattern obtained from the resin composition, and a method for synthesizing the polymer.

Means for Solving the Problem

The present invention provides a resin composition for forming an insulating film comprising a polymer having a structural unit of the following formula (1a) and a structural unit of the following formula (1b); and an organic solvent:

  (1a)

  (1b)

[wherein $T_0$ is a divalent organic group containing at least one arylene group in which at least one hydrogen atom is substituted with an amino group; and $T_1$ is a divalent organic group containing at least one arylene group having at least one substituent, wherein the substituent is a substituent of the following formula (2):

  (2)

(wherein Z is a divalent aliphatic hydrocarbon group or alicyclic hydrocarbon group)].

The present invention also provides a resin composition for forming an insulating film comprising a polymer obtained by reacting a polymer having a structural unit of formula (1a) above with a monomer of the following formula (14):

  (14)

(wherein Z is a divalent, aliphatic, aromatic, or alicyclic group optionally having a substituent); and an organic solvent. In the resin composition for forming an insulating film, the polymer having a structural unit of formula (1a) above does not contain a structural unit of formula (1b) above.

The present invention also provides a method for forming a pattern comprising the steps of applying the resin composition for forming an insulating film according to the present invention onto a substrate, and drying the resin composition to form a coating film; exposing the coating film to g-line, h-line, i-line, broadband ghi-line, or a KrF excimer laser; and developing the exposed film with an aqueous alkaline solution or an organic solvent.

The present invention also provides a method for synthesizing a polymer having a structural unit of the following formula (1a) and a structural unit of the following formula (1b), the method being characterized in that a solution obtained by dissolving a polymer having the structural unit of the following formula (1a) and a monomer of the following formula (14) in an organic solvent is heated to react the polymer and the monomer:

$+T_0\text{-O}+$  (1a)

[wherein $T_0$ is a divalent organic group of the following formula (11):

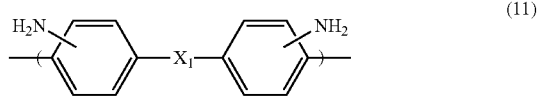  (11)

(wherein $X_1$ is a single bond, a $C_{1-3}$ alkylene group, a $C_{1-3}$ fluoroalkylene group, a phenylene group, an —O— group, a —S— group, a sulfonyl group, a carbonyl group, or a combination of the phenylene group with the $C_{1-3}$ alkylene group, the —O— group, or the —S— group)];

  (14)

[wherein Z is a divalent group of the following formula (3), (4), (5), or (6):

  (3)

  (4)

  (5)

  (6)

(wherein m is 1 or 2; $R_1$ is a hydrogen atom, a $C_{1-18}$ alkyl group, a hydroxy group, a carboxy group, or an alkoxysilyl group; n is 0 or 1; $R_2$ is a hydrogen atom, a $C_{1-18}$ alkyl group, a vinyl group, an allyl group, a 2-buten-1-yl group, a 2-methyl-2-propenyl group, a 1-propenyl group, or an alkoxysilyl group, wherein the alkyl group optionally has an alkoxysilyl group as a substituent; and $R_3$ is a methylene group, an ethylene group, an ethene-1,2-diyl group, or a vinylidene group)];

  (1b)

[wherein $T_1$ is a divalent organic group of the following formula (12):

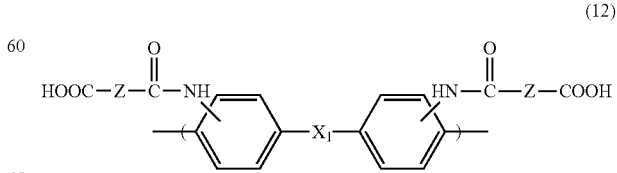  (12)

(wherein $X_1$ is as defined in formula (11) above; and Z is as defined in formula (14) above)].

Effects of the Invention

In the film obtained from the resin composition for forming an insulating film of the present invention, the polymer contained in the composition has a substituent of formula (2) above, which allows a desired pattern to be formed on the film through the exposure and development steps. The film obtained from the resin composition for forming an insulating film of the present invention can also be provided with high insulating properties by being heated at a temperature not higher than 250° C., for example, 200 to 250° C.

MODES FOR CARRYING OUT THE INVENTION

The resin composition for forming an insulating film of the present invention comprises a polymer having a structural unit of formula (1a) above and a structural unit of formula (1b) above. In formula (1b) above, $T_1$ is a divalent organic group containing at least one arylene group having at least one substituent of formula (2) above. The substituent of formula (2) above is cyclodehydrated by heating to form a group of the following formula (2'):

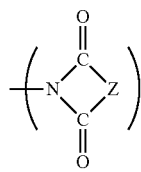

(2')

The polymer having a structural unit of formula (1a) above and a structural unit of formula (1b) above contained in the resin composition for forming an insulating film of the present invention is obtained by reacting a polymer having the structural unit of formula (1a) above with a monomer of formula (14) above (wherein Z is a divalent aliphatic, aromatic, or alicyclic group optionally having a substituent). Specifically, a solution obtained by dissolving the polymer having a structural unit of formula (1a) above and the monomer of formula (14) above in an organic solvent is maintained at a predetermined temperature and stirred until the reaction is completed. The content of the monomer of formula (14) above relative to the polymer having a structural unit of formula (1a) above is not particularly limited as long as it does not impair the characteristics of the resulting polymer; it is, for example, 10 to 200 mol %, preferably 50 to 150 mol %, and more preferably 70 to 120 mol % or 80 to 120 mol %, relative to the amino group of the polymer. The solution temperature during the reaction is, for example, −20 to 100° C., and preferably 0 to 80° C. The reaction time is, for example, 1 to 48 hours, and preferably 1 to 24 hours. The organic solvent is preferably an organic solvent not having a hydroxy group. If an organic solvent having a hydroxy group is used, the monomer of formula (14) above reacts with the organic solvent during the reaction to form a by-product, which makes the reaction difficult to control. The organic solvent is more preferably an organic solvent that can be used in the manufacturing process of semiconductor devices. For example, the following organic solvents are preferably used: ketones such as cyclohexanone, methyl isoamyl ketone, and 2-heptanone; derivatives of polyhydric alcohols such as monomethyl ether, monoethyl ether, monopropyl ether, monobutyl ether, or monophenyl ether of ethylene glycol monoacetate, diethylene glycol monoacetate, propylene glycol monoacetate, and dipropylene glycol monoacetate; cyclic ethers such as dioxane; esters such as methyl lactate, ethyl lactate, methyl acetate, ethyl acetate, butyl acetate, methyl pyruvate, ethyl pyruvate, methyl methoxypropionate, and ethyl ethoxypropionate; amides such as N-methyl-2-pyrrolidinone and N,N-2-trimethylpropionamide.

Examples of the monomer of formula (14) above include succinic anhydride, 2,2-dimethylsuccinic anhydride, butylsuccinic anhydride, n-octylsuccinic anhydride, decylsuccinic anhydride, dodecylsuccinic anhydride, tetradecylsuccinic anhydride, hexadecylsuccinic anhydride, octadecylsuccinic anhydride, itaconic anhydride, allylsuccinic anhydride, (2-methyl-2-propenyl)succinic anhydride, 2-buten-1-ylsuccinic anhydride, 2-hexen-1-ylsuccinic anhydride, 2-octenylsuccinic anhydride, (2,7-octadien-1-yl)succinic anhydride, 2-dodecen-1-ylsuccinic anhydride, trimethoxysilylsuccinic anhydride, triethoxysilylsuccinic anhydride, trimethoxysilylpropylsuccinic anhydride, triethoxysilylpropylsuccinic anhydride, cis-1,2-cyclohexanedicarboxylic anhydride, (±)-trans-1,2-cyclohexanedicarboxylic anhydride, 4-methylcyclohexane-1,2-dicarboxylic anhydride, cis-1,2-cyclopentanedicarboxylic anhydride, 1,2-cyclopropanedicarboxylic anhydride, 3,3-dimethyl-1,2-cyclopropanedicarboxylic anhydride, glutaric anhydride, 3,3-dimethylglutaric anhydride, 2,2-dimethylglutaric anhydride, 3-methylglutaric anhydride, 1,1-cyclopentanediacetic anhydride, 1,1-cyclohexanediacetic anhydride, cis-4-cyclohexene-1,2-dicarboxylic anhydride, 3-methyl-4-cyclohexene-1,2-dicarboxylic anhydride, 4-methyl-4-cyclohexene-1,2-dicarboxylic anhydride, phthalic anhydride, 3-methylphthalic anhydride, 4-methylphthalic anhydride, 1,2-naphthalenedicarboxylic anhydride, 2,3-naphthalenedicarboxylic anhydride, 1,8-naphthalenedicarboxylic anhydride, trimellitic anhydride, 4-hydroxyphthalic anhydride, 5-norbornene-2,3-dicarboxylic anhydride, 5-trimethoxysilylnorbornane-2,3-dicarboxylic anhydride, 5-triethoxysilylnorbornane-2,3-dicarboxylic anhydride, and bicyclo[2.2.2]oct-5-ene-2,3-dicarboxylic anhydride. Among these acid anhydrides, succinic anhydride, itaconic anhydride, cis-1,2-cyclohexanedicarboxylic anhydride, 4-methylcyclohexane-1,2-dicarboxylic anhydride, cis-4-cyclohexene-1,2-dicarboxylic anhydride, phthalic anhydride, 4-methylphthalic anhydride, trimellitic anhydride, and glutaric anhydride are preferred in that they are readily available at relatively low cost.

The weight average molecular weight of the polymer is, for example, 1,000 to 100,000 or 3,000 to 50,000, as determined by GPC analysis relative to standard polystyrene.

In each of the substituent of formula (2) above, the group of formula (2') above, and the monomer of formula (14) above, Z is, for example, a divalent group of the following formula (3), (4), (5), or (6):

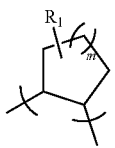

(3)

-continued

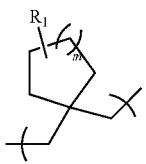 (4)

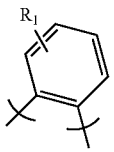 (5)

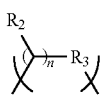 (6)

(wherein m is 1 or 2; $R_1$ is a hydrogen atom, a $C_{1-18}$ alkyl group, a hydroxy group, a carboxy group, or an alkoxysilyl group; n is 0 or 1; $R_2$ is a hydrogen atom, a $C_{1-18}$ alkyl group, a vinyl group, an allyl group, a 2-buten-1-yl group, a 2-methyl-2-propenyl group, a 1-propenyl group, or an alkoxysilyl group, wherein the alkyl group optionally has an alkoxysilyl group as a substituent; and $R_3$ is a methylene group, an ethylene group, an ethene-1,2-diyl group, or a vinylidene group).

The polymer having a structural unit of formula (1a) above and a structural unit of formula (1b) above or the polymer having a structural unit of formula (1a) above may further contain a structural unit of the following formula (7):

 (7)

(wherein $T_2$ is a divalent organic group containing at least one arylene group).

$T_0$ in the structural unit of formula (1a) above is, for example, a divalent organic group of formula (11) above, and $T_1$ in the structural unit of formula (1b) above is, for example, a divalent organic group of the following formula (12):

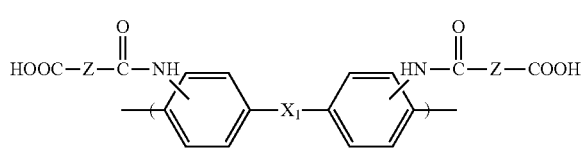 (12)

(wherein Z is as defined in formula (2) above; and $X_1$ is a single bond, a $C_{1-3}$ alkylene group, a $C_{1-3}$ fluoroalkylene group, a phenylene group, an —O— group, a —S— group, a sulfonyl group, a carbonyl group, or a combination of the phenylene group with the $C_{1-3}$ alkylene group, the —O— group, or the —S— group).

$T_2$ in the structural unit of formula (7) above is, for example, a divalent organic group of the following formula (13):

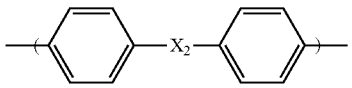 (13)

(wherein $X_2$ is a single bond, a $C_{1-3}$ alkylene group, a $C_{1-3}$ fluoroalkylene group, a divalent $C_{6-13}$ hydrocarbon group containing a benzene ring or a cyclohexane ring, an —O— group, a —S— group, a sulfonyl group, or a carbonyl group).

The resin composition for forming an insulating film of the present invention may further contain a photosensitizer. For example, a photoradical generator or a photoacid generator may be adopted as the photosensitizer.

Examples of the photoradical generator include organic peroxides such as tert-butylperoxy-iso-butyrate, 2,5-dimethyl-2,5-bis(benzoyldioxy)hexane, 1,4-bis[α-(tert-butyldioxy)-iso-propoxy]benzene, di-tert-butylperoxide, 2,5-dimethyl-2,5-bis(tert-butyldioxy)hexenehydroperoxide, α-(isopropylphenyl)-iso-propylhydroperoxide, tert-butylhydroperoxide, 1,1-bis(tert-butyldioxy)-3,3,5-trimethylcyclohexane, butyl-4,4-bis(tert-butyldioxy) valerate, cyclohexanone peroxide, 2,2',5,5'-tetra(tert-butylperoxycarbonyl)benzophenone, 3,3',4,4'-tetra(tert-butylperoxycarbonyl)benzophenone, 3,3',4,4'-tetra(tert-amylperoxycarbonyl)benzophenone, 3,3',4,4'-tetra(tert-hexylperoxycarbonyl)benzophenone, 3,3'-bis(tert-butylperoxycarbonyl)-4,4'-dicarboxybenzophenone, tert-butyl peroxybenzoate, and di-tert-butyldiperoxyisophthalate; quinones such as 9,10-anthraquinone, 1-chloroanthraquinone, 2-chloroanthraquinone, octamethylanthraquinone, and 1,2-benzanthraquinone; benzoin derivatives such as benzoin methyl, benzoin ethyl ether, α-methylbenzoin, and α-phenylbenzoin; alkylphenone-based compounds such as 2,2-dimethoxy-1,2-diphenylethan-1-one, 1-hydroxy-cyclohexyl-phenyl-ketone, 2-hydroxy-2-methyl-1-phenyl-propan-1-one, 1-[4-(2-hydroxyethoxy)-phenyl]-2-hydroxy-2-methyl-1-propan-1-one, 2-hydroxy-1-[4-{4-(2-hydroxy-2-methyl-propionyl)benzyl}-phenyl]-2-methyl-propan-1-one, phenylglyoxylic acid methyl ester, 2-methyl-1-[4-(methylthio)phenyl]-2-morpholinopropan-1-one, 2-benzyl-2-dimethylamino-1-(4-morpholinophenyl)-1-butanone, and 2-dimethylamino-2-(4-methyl-benzyl)-1-(4-morpholin-4-yl-phenyl)-butan-1-one; acylphosphine oxide-based compounds such as bis(2,4,6-trimethylbenzoyl)-phenylphosphine oxide and 2,4,6-trimethylbenzoyl-diphenyl-phosphine oxide; and oxime ester-based compounds such as 1-[4-(phenylthio)phenyl]-1,2-octanedione 2-(O-benzoyloxime) and 1-[9-ethyl-6-(2-methylbenzoyl)-9H-carbazol-3-yl]ethanone O-acetyloxime.

The photoradical generator is commercially available, and examples thereof include IRGACURE (registered trademark) 651, 184, 500, 2959, 127, 754, 907, 369, 379, 379EG, 819, 819DW, 1800, 1870, 784, OXE01, OXE02, 250, 1173, MBF, TPO and 4265 (all from BASF Japan Ltd.), KAYA-CURE (registered trademark) DETX, MBP, DMBI, EPA and OA (all from Nippon Kayaku Co., Ltd.), VICURE-10 and -55 (both from STAUFFER Co. LTD), ESACURE KIP150, TZT, 1001, KT046, KB1, KL200, KS300 and EB3, Triazine-PMS, Triazine A and Triazine B (all from Japan Siber-Hegner KK), ADEKA OPTOMER N-1717, N-1414 and N-1606 (all from ADEKA CORPORATION). These photoradical generators may be used alone or in combination of two or more.

The photoacid generator is not particularly limited as long as it is a compound that generates an acid upon irradiation with light; it is preferably a photoacid generator having the function of increasing the solubility of an irradiated portion in an alkaline developing solution, and is particularly preferably a 1,2-naphthoquinone diazide compound. As the 1,2-naphthoquinonediazide compound, a compound having hydroxy groups, in which 10 to 100 mol %, preferably 20 to 100 mol %, of the hydroxy groups have been 1,2-naphthoquinone diazide sulfonic acid esterified, can be used. Examples of the compound having hydroxy groups include phenol compounds such as phenol, o-cresol, m-cresol, p-cresol, hydroquinone, resorcinol, catechol, methyl gallate, ethyl gallate, 1,3,3-tris(4-hydroxyphenyl)butane, 4,4'-isopropylidene diphenol, 1,1-bis(4-hydroxyphenyl)cyclohexane, 4,4'-dihydroxyphenyl sulfone, 4,4'-(hexafluoroisopropylidene)diphenol, 4,4',4''-trishydroxyphenylethane, 1,1,1-trishydroxyphenylethane, 4,4'-[1-[4-[1-(4-hydroxyphenyl)-1-methylethyl]phenyl]ethylidene] bisphenol, 2,4-dihydroxybenzophenone, 2,3,4-trihydroxybenzophenone, 2,2',4,4'-tetrahydroxybenzophenone, 2,3,4,4'-tetrahydroxybenzophenone, and 2,2',3,4,4'-pentahydroxybenzophenone; and aliphatic alcohols such as ethanol, 2-propanol, 4-butanol, cyclohexanol, ethylene glycol, propylene glycol, diethylene glycol, dipropylene glycol, 2-methoxyethanol, 2-butoxyethanol, 2-methoxypropanol, 2-butoxypropanol, ethyl lactate, and butyl lactate. These photoacid generators may be used alone or in combination of two or more.

The amount of the photosensitizer contained in the composition for forming an insulating film of the present invention is, for example, 0.1 to 50 phr or 1 to 30 phr, relative to the amount of the polymer. As used herein, "phr" refers to the mass of the photosensitizer relative to a mass of 100 g of the polymer.

The resin composition for forming an insulating film of the present invention may further contain a crosslinking agent. The crosslinking agent is, for example, at least one selected from the group consisting of a thermally or acid reactive crosslinking agent and a radical reactive crosslinking agent.

Examples of the thermally or acid reactive crosslinking agent include a melamine compound, a guanamine compound, a glycoluril compound, a urea compound, a phenolic compound, or an ether compound of phenol substituted with at least one group selected from a methylol group, an alkoxymethyl group, and an acyloxymethyl group; and compounds containing double bonds such as an epoxy compound, an oxetane compound, a thioepoxy compound, an isocyanate compound, an azide compound, or an alkenyl ether group. Preferred among these compounds is an isocyanate compound, and particularly preferred is a blocked isocyanate compound, from the viewpoint of heat resistance and insulating properties. These thermally or acid reactive crosslinking agents may be used alone or in combination of two or more.

The blocked isocyanate compound is commercially available, and examples thereof include VESTANAT (registered trademark) B1358/100, VESTAGON (registered trademark) B1065 (both from Evonik Industries Ltd.), TAKENATE (registered trademark) B-882N (from Mitsui Chemicals, Inc.), DURANATE (registered trademark) MF-K60X, E402-B80B and SBN-70D (all from Asahi Kasei Corporation), TRIXENEBI-7982, BI-7990 and BI-7992 (all from Baxenden Ltd.). These blocked isocyanate compounds may be used alone or in combination of two or more.

A catalyst may be added to improve the reactivity of the blocked isocyanate compound. Examples of the catalyst include basic compounds such as triethylamine, tributylamine, triethanolamine, tributanolamine, 1,8-diazabicyclo[5.4.0]-7-undecene, and 1,5-diazabicyclo[4.3.0]-5-nonene.

Examples of the radical reactive crosslinking agent include a methacrylic compound, an acrylic compound, a vinyl compound, and an allyl compound, with an acrylic compound being particularly preferred.

Examples of the acrylic compound include NK Ester (registered trademark) A-9300, A-9300-1CL, A-GLY-9E, A-GLY-20E, A-TMM-3, A-TMM-3L, A-TMM-3LN, A-TMPT, AD-TMP, ATM-35E, A-TMMT, A-9550 and A-DPH (all from Shin Nakamura Chemical Co., Ltd.). These acrylic compounds may be used alone or in combination of two or more.

The amount of the crosslinking agent contained in the composition for forming an insulating film of the present invention is, for example, 5 to 100 phr, preferably 10 to 100 phr or 5 to 50 phr, and more preferably 10 to 40 phr or 20 to 50 phr, relative to the amount of the polymer.

The resin composition for forming an insulating film of the present invention may further contain other additives, as required. Examples of such additives include a chain transfer agent, a pH adjuster, a surfactant, and a silane coupling agent.

For example, a polyfunctional thiol compound may be adopted as the chain transfer agent. Examples of the polyfunctional thiol compound include pentaerythritol tetrakis (3-mercaptobutyrate), 1,4-bis(3-mercaptobutyryloxy)butane, 1,3,5-tris(3-mercaptobutyryloxyethyl)-1,3,5-triazine-2,4,6(1H,3H,5H)-trione, trimethylolpropane tris(3-mercaptobutyrate), and trimethylolethane tris(3-mercaptobutyrate).

The polyfunctional thiol compound is commercially available, and examples thereof include Karenz MT (registered trademark) PE1, BD1 and NR1 (all from Showa Denko K.K.). These polyfunctional thiol compounds may be used alone or in combination of two or more.

When the resin composition for forming an insulating film of the present invention contains a chain transfer agent, the amount of the chain transfer agent is, for example, 0.1 to 10 phr, relative to the amount of the polymer.

The pH adjuster is preferably a weakly acidic organic compound, and examples thereof include fumaric acid, maleic acid, succinic acid, oxalic acid, acetic acid, tartaric acid, octanoic acid, nonanoic acid, and decanoic acid.

When the resin composition for forming an insulating film of the present invention contains a pH adjuster, the amount of the pH adjuster is, for example, 0.1 to 10 phr, relative to the amount of the polymer.

Examples of the surfactant include nonionic surfactants including polyoxyethylene alkyl ethers such as polyoxyethylene lauryl ether, polyoxyethylene stearyl ether, polyoxyethylene cetyl ether, and polyoxyethylene oleyl ether; polyoxyethylene alkyl aryl ethers such as polyoxyethylene octylphenyl ether and polyoxyethylene nonylphenyl ether; polyoxyethylene-polyoxypropylene block copolymers; sorbitan fatty acid esters such as sorbitan monolaurate, sorbitan monopalmitate, sorbitan monostearate, sorbitan monooleate, sorbitan trioleate, and sorbitan tristearate; and polyoxyethylene sorbitan fatty acid esters such as polyoxyethylene sorbitan monolaurate, polyoxyethylene sorbitan monopalmitate, polyoxyethylene sorbitan monostearate, polyoxyethylene sorbitan trioleate, and polyoxyethylene sorbitan tristearate.

The surfactant is commercially available, and examples thereof include fluorosurfactants such as EFTOP (registered trademark) EF301, EF303 and EF352 (from Mitsubishi Materials Electronic Chemicals Co., Ltd.), MEGAFACE (registered trademark) F-553, F-554, F-556, F-477, F171, F173, R-08, R-30, R-30N, R-40 and R-40-LM (from DIC Corporation), Fluorad FC430 and FC431 (from Sumitomo 3M Co., Ltd.), trade name AsahiGuard (registered trademark) AG710, Surflon (registered trademark) S-382, SC101, SC102, SC103, SC104, SC105 and SC106 (from Asahi Glass Co., Ltd.); and organosiloxane polymer KP341 (from Shin-Etsu Chemical Co., Ltd.). These surfactants may be used alone or in combination of two or more.

When the resin composition for forming an insulating film of the present invention contains a surfactant, the amount of the surfactant is, for example, 0.001 to 1 phr, relative to the amount of the polymer.

Examples of the silane coupling agent include phenyltrimethoxysilane, phenyltriethoxysilane, methyltrimethoxysilane, methyltriethoxysilane, ethyltrimethoxysilane, ethyltriethoxysilane, vinyltrimethoxysilane, vinyltriethoxysilane, 3-methacryloxypropyltriethoxysilane, 3-methacryloxypropyltrimethoxysilane, 3-glycidylpropyltrimethoxysilane, 3-glycidylpropyltriethoxysilane, 2-(3,4-epoxycyclohexyl)propyltrimethoxysilane, 2-(3,4-epoxycyclohexyl)propyltriethoxysilane, 2-(3,4-epoxycyclohexyl)ethyltrimethoxysilane, 2-(3,4-epoxycyclohexyl)ethyltriethoxysilane, 2-(3,4-epoxycyclohexyl)methyltrimethoxysilane, 2-(3,4-epoxycyclohexyl)methyltriethoxysilane, 3-aminopropyltriethoxysilane, 3-aminopropyltrimethoxysilane, 3-phenylaminopropyltrimethoxysilane, 3-phenylaminopropyltriethoxysilane, trimethoxysilylsuccinic anhydride, triethoxysilylsuccinic anhydride, trimethoxysilylpropylsuccinic anhydride, triethoxysilylpropylsuccinic anhydride, 5-trimethoxysilylnorbornane-2,3-dicarboxylic anhydride, 5-triethoxysilylnorbornane-2,3-dicarboxylic anhydride, and N-(3-triethoxysilylpropyl)-4,5-dihydroimidazole.

When the resin composition for forming an insulating film of the present invention contains a silane coupling agent, the amount of the silane coupling agent is, for example, 0.1 to 5 phr, relative to the amount of the polymer.

The resin composition for forming an insulating film of the present invention contains an organic solvent as a viscosity modifier. The organic solvent is not particularly limited as long as it is a solvent that can be used in the manufacturing process of semiconductor devices. For example, the following organic solvents are preferably used: ketones such as cyclohexanone, methyl isoamyl ketone, and 2-heptanone; polyhydric alcohols and derivatives thereof such as monomethyl ether, monoethyl ether, monopropyl ether, monobutyl ether, or monophenyl ether of ethylene glycol, ethylene glycol monoacetate, diethylene glycol, diethylene glycol monoacetate, propylene glycol, propylene glycol monoacetate, dipropylene glycol, or dipropylene glycol monoacetate; cyclic ethers such as dioxane; esters such as methyl lactate, ethyl lactate, methyl acetate, ethyl acetate, butyl acetate, methyl pyruvate, ethyl pyruvate, methyl methoxypropionate, and ethyl ethoxypropionate; and amides such as N-methyl-2-pyrrolidinone and N,N-2-trimethylpropionamide. These solvents may be used alone or in combination of two or more.

The solids concentration in the resin composition for forming an insulating film of the present invention from which the organic solvent has been removed is, for example, 10 to 50% by mass.

EXAMPLES

The present invention will be hereinafter described in more detail based on examples; however, the present invention is not limited to these examples.

[Polymer Molecular Weight]

The weight average molecular weight of the polymer obtained in each of the synthesis examples shown below is a relative value measured with the following apparatus. The measurement conditions are as follows:

Apparatus: integral high-speed GPC system, HLC-8220GPC, from Tosoh Corporation
Column: KF-G, KF803L and KF804L
Column temperature: 40° C.
Solvent: tetrahydrofuran (THF)
Flow rate: 1.0 mL/min
Standard sample: polystyrene
Detector: RI Synthesis Example 1

In a three-necked flask equipped with a stirrer, a thermometer, and a Dimroth condenser, 61.02 g of bis(4-fluorophenyl)sulfone and 109.90 g of 2,2-bis(3-amino-4-hydroxyphenyl)hexafluoropropane were dissolved in 678.45 g of 1-methyl-2-pyrrolidinone, and then 83.18 g of potassium carbonate was added thereto. The system was then purged with nitrogen. The mixture was subsequently heated to 140° C. and reacted for 20 hours. After the completion of the reaction, the reaction solution was suction filtered through a Hirsch funnel. To the resulting filtrate, a solution of (2N-hydrochloric acid):(1-methyl-2-pyrrolidinone)=1:9 (volume ratio) was added until the filtrate became acidic, and then a pH test paper was used to confirm that the solution was acidic. The resulting solution was subsequently added dropwise to a mixed solution of water:methanol=3:7 (volume ratio) and reprecipitated. After the dropwise addition, the resulting product was suction filtered through a Buchner funnel, and washed with the mixed solution of water:methanol=3:7. The resulting powder was dried in a vacuum dryer heated to 70° C. for 12 hours to give an aromatic polyether having a structural unit of the following formula (14). GPC analysis revealed that the resulting aromatic polyether had a weight average molecular weight of 6,700 relative to standard polystyrene.

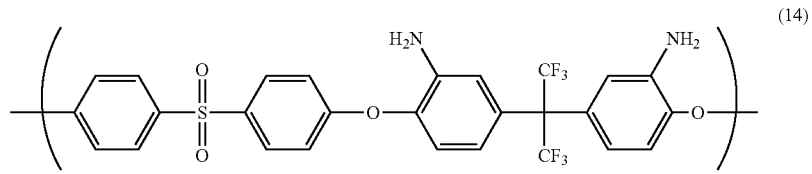

(14)

Synthesis Example 2

In a three-necked flask equipped with a stirrer, a thermometer, and a Dimroth condenser, 52.36 g of 4,4'-difluorobenzophenone and 109.88 g of 2,2-bis(3-amino-4-hydroxyphenyl)hexafluoropropane were dissolved in 655.97 g of 1-methyl-2-pyrrolidinone, and then 83.04 g of potassium carbonate was added thereto. The system was then purged with nitrogen. The mixture was heated to 140° C. and reacted for 20 hours. After the completion of the reaction, the reaction solution was suction filtered through a Hirsch funnel. To the resulting filtrate, a solution of (2N-hydrochloric acid):(1-methyl-2-pyrrolidinone)=1:9 (volume ratio) was added until the filtrate became acidic, and then a pH test paper was used to confirm that the solution was acidic. The resulting solution was subsequently added dropwise to a mixed solution of water:methanol=3:7 (volume ratio) and reprecipitated. After the dropwise addition, the resulting product was suction filtered through a Buchner funnel, and washed with the mixed solution of water:methanol=3:7. The resulting powder was dried in a vacuum dryer heated to 70° C. for 12 hours to give an aromatic polyether having a structural unit of the following formula (15). GPC analysis revealed that the resulting aromatic polyether had a weight average molecular weight of 8,000 relative to standard polystyrene.

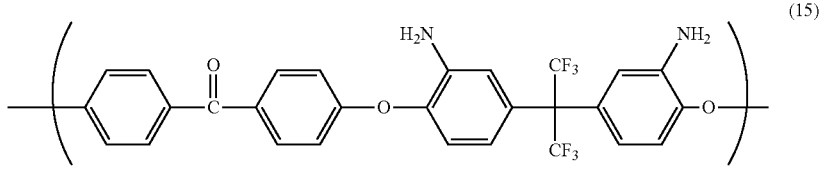

(15)

Comparative Synthesis Example 1

In a three-necked flask equipped with a stirrer, a thermometer, and a Dimroth condenser, 12.08 g of bis(4-fluorophenyl)sulfone and 16.81 g of 2,2-bis(4-hydroxyphenyl)hexafluoropropane were dissolved in 115.55 g of 1-methyl-2-pyrrolidinone, and then 20.73 g of potassium carbonate was added thereto. The system was then purged with nitrogen. The mixture was subsequently heated to 140° C. and reacted for 20 hours. After the completion of the reaction, the reaction solution was suction filtered through a Hirsch funnel. To the resulting filtrate, a solution of 2N-hydrochloric acid:1-methyl-2-pyrrolidinone=1:9 (volume ratio) was added until the filtrate became acidic, and then a pH test paper was used to confirm that the solution was acidic. The resulting solution was subsequently added dropwise to methanol and reprecipitated. After the dropwise addition, the resulting product was suction filtered through a Buchner funnel, and washed with methanol. The resulting powder was dried in a vacuum dryer heated to 70° C. for 12 hours to give an aromatic polyether having a structural unit of the following formula (16). GPC analysis revealed that the resulting aromatic polyether had a weight average molecular weight of 24,000 relative to standard polystyrene.

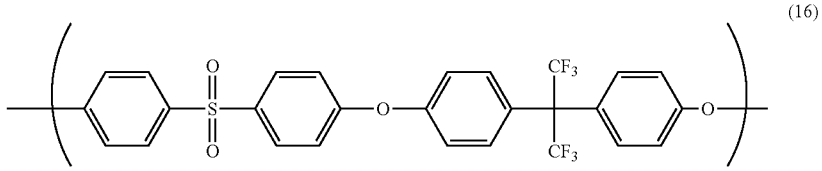

(16)

Comparative Synthesis Example 2

In a three-necked flask equipped with a stirrer, a thermometer, and a Dimroth condenser, 25.43 g of bis(4-fluorophenyl)sulfone and 15.40 g of 3,5-dihydroxybenzoic acid were dissolved in 164.65 g of 1-methyl-2-pyrrolidinone, and then 41.46 g of potassium carbonate was added thereto. The system was then purged with nitrogen. The mixture was subsequently heated to 140° C. and reacted for 20 hours. After the completion of the reaction, the reaction solution was suction filtered through a Hirsch funnel. To the resulting filtrate, a solution of 2N-hydrochloric acid:1-methyl-2-pyrrolidinone=1:9 (volume ratio) was added until the filtrate became acidic, and then a pH test paper was used to confirm that the solution was acidic. The resulting solution was subsequently added dropwise to methanol and reprecipitated. After the dropwise addition, the resulting product was suction filtered through a Buchner funnel, and washed with methanol. The resulting powder was dried in a vacuum dryer heated to 70° C. for 12 hours to give an aromatic polyether having a structural unit of the following formula (17). GPC analysis revealed that the resulting aromatic polyether had a weight average molecular weight of 12,000 relative to standard polystyrene.

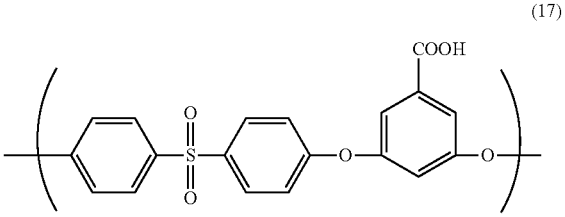

(17)

Comparative Synthesis Example 3

In a three-necked flask equipped with a stirrer, a thermometer, and a Dimroth condenser, 8.88 g of 4,4'-(hexafluoroisopropylidene)diphthalic anhydride and 4.72 g of bis(4-aminophenyl)sulfone were dissolved in 54.48 g of N,N,2-trimethylpropionamide. The system was then purged with nitrogen. The mixture was subsequently heated to 40° C. and reacted for 24 hours. After the completion of the reaction, the resulting solution was added dropwise to a mixed solution of water:isopropyl alcohol=1:9 (volume ratio) and reprecipitated. After the dropwise addition, the resulting product was suction filtered through a Buchner funnel, and washed with the mixed solution of water:isopropyl alcohol=1:9 (volume ratio). The resulting powder was dried in a vacuum dryer heated to 50° C. for 12 hours to give a polyimide precursor having a structural unit of the following formula (18). GPC analysis revealed that the resulting polyimide precursor had a weight average molecular weight of 14,000 relative to standard polystyrene.

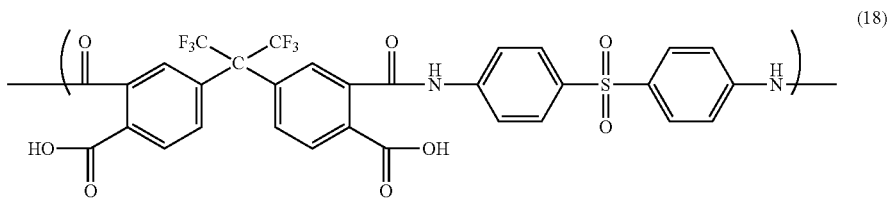

(18)

Comparative Synthesis Example 4

In a three-necked flask equipped with a stirrer, a thermometer, and a Dimroth condenser, 3.05 g of bis(4-fluorophenyl)sulfone and 9.94 g of a compound of the following formula (19) were dissolved in 51.95 g of 1-methyl-2-pyrrolidinone, and then 4.15 g of potassium carbonate was added thereto. The system was then purged with nitrogen. The mixture was subsequently heated to 140° C. and reacted for 20 hours. After the completion of the reaction, the reaction solution was suction filtered through a Hirsch funnel. To the resulting filtrate, a solution of 2N-hydrochloric acid:1-methyl-2-pyrrolidinone=1:9 (volume ratio) was added until the filtrate became acidic, and then a pH test paper was used to confirm that the solution was acidic. The resulting solution was subsequently added dropwise to water and reprecipitated. After the dropwise addition, the resulting product was suction filtered through a Buchner funnel, and washed with water. The resulting powder was dried in a vacuum dryer heated to 50° C. for 12 hours to give an aromatic polyether having a structural unit of the following formula (20). GPC analysis revealed that the resulting aromatic polyether had a weight average molecular weight of 5,100 relative to standard polystyrene.

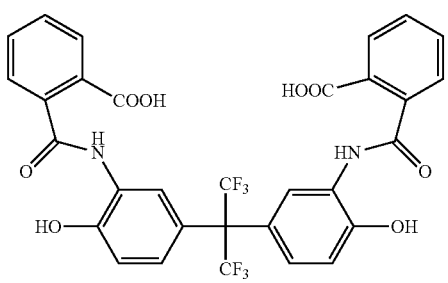

(19)

-continued

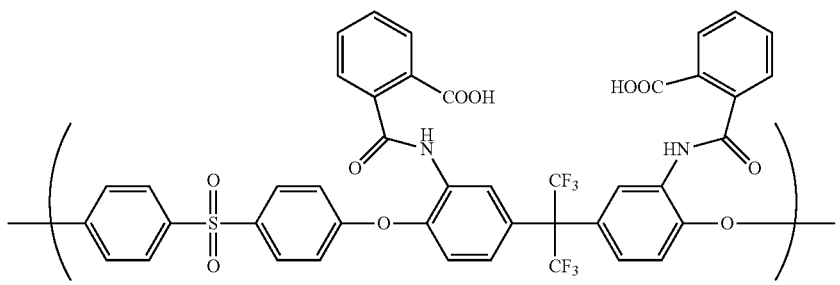

(20)

[Preparation of Resin Compositions]
[Amino Group Conversion]

The amino group conversion of the aromatic polyether obtained in each of the examples shown below was calculated by measuring the total amine values before and after the reaction. The measurement of total amine values was performed in accordance with the method described in JIS K7237.

Example 1

In a three-necked flask equipped with a stirrer, a thermometer, and a Dimroth condenser, 2.50 g of the aromatic polyether obtained in Synthesis Example 1 and 0.84 g of succinic anhydride were dissolved in 13.36 g of propylene glycol monomethyl ether acetate. The system was then purged with nitrogen. The mixture was subsequently heated to 80° C. and reacted for 1 hour. The reaction solution was cooled to room temperature, and then filtered through a polytetrafluoroethylene (hereinafter abbreviated to PTFE) microfilter having a pore size of 1.0 μm to prepare a resin composition containing 20% by mass of an aromatic polyether having a side chain structure of the following formula (21). The amino group conversion of the resulting aromatic polyether was 96%.

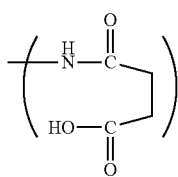

(21)

Example 2

In a three-necked flask equipped with a stirrer, a thermometer, and a Dimroth condenser, 3.00 g of the aromatic polyether obtained in Synthesis Example 1 and 1.49 g of phthalic anhydride were dissolved in 17.96 g of propylene glycol monomethyl ether acetate. The system was then purged with nitrogen. The mixture was subsequently heated to 80° C. and reacted for 1 hour. The reaction solution was cooled to room temperature, and then filtered through a PTFE microfilter having a pore size of 1.0 μm to prepare a resin composition containing 20% by mass of an aromatic polyether having a side chain structure of the following formula (22). The amino group conversion of the resulting aromatic polyether was 91%.

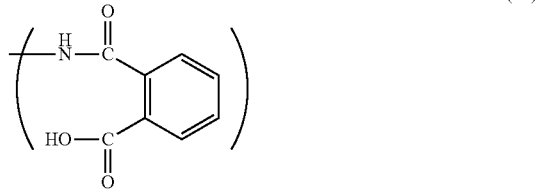

(22)

Example 3

In a three-necked flask equipped with a stirrer, a thermometer, and a Dimroth condenser, 3.00 g of the aromatic polyether obtained in Synthesis Example 1 and 1.09 g of itaconic anhydride were dissolved in 16.37 g of propylene glycol monomethyl ether acetate. The system was then purged with nitrogen. The mixture was subsequently heated to 80° C. and reacted for 1 hour. The reaction solution was cooled to room temperature, and then filtered through a PTFE microfilter having a pore size of 1.0 μm to prepare a resin composition containing 20% by mass of an aromatic polyether having a side chain structure of the following formula (23). The amino group conversion of the resulting aromatic polyether was 95%.

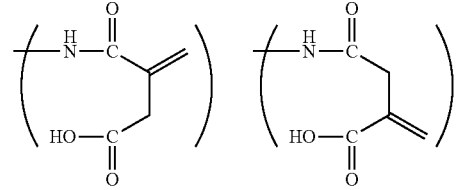

(23)

Example 4

In a three-necked flask equipped with a stirrer, a thermometer, and a Dimroth condenser, 3.00 g of the aromatic polyether obtained in Synthesis Example 1 and 1.50 g of cis-cyclohexane-1,2-dicarboxylic anhydride were dissolved in 18.01 g of propylene glycol monomethyl ether acetate. The system was then purged with nitrogen. The mixture was subsequently heated to 80° C. and reacted for 1 hour. The reaction solution was cooled to room temperature, and then filtered through a PTFE microfilter having a pore size of 1.0 μm to prepare a resin composition containing 20% by mass of an aromatic polyether having a side chain structure of the following formula (24). The amino group conversion of the resulting aromatic polyether was 95%.

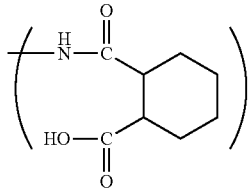
(24)

Example 5

In a three-necked flask equipped with a stirrer, a thermometer, and a Dimroth condenser, 3.00 g of the aromatic polyether obtained in Synthesis Example 1 and 1.64 g of 4-methylcyclohexane-1,2-dicarboxylic anhydride were dissolved in 18.56 g of propylene glycol monomethyl ether acetate. The system was then purged with nitrogen. The mixture was subsequently heated to 80° C. and reacted for 1 hour. The reaction solution was cooled to room temperature, and then filtered through a PTFE microfilter having a pore size of 1.0 μm to prepare a resin composition containing 20% by mass of an aromatic polyether having a side chain structure of the following formula (25). The amino group conversion of the resulting aromatic polyether was 95%.

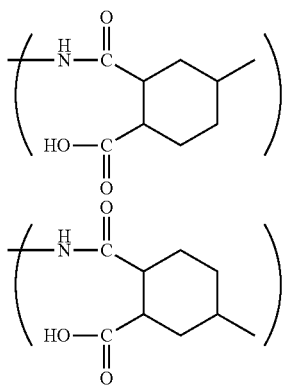
(25)

Example 6

In a three-necked flask equipped with a stirrer, a thermometer, and a Dimroth condenser, 3.00 g of the aromatic polyether obtained in Synthesis Example 2 and 1.85 g of 4-methylcyclohexane-1,2-dicarboxylic anhydride were dissolved in 19.41 g of propylene glycol monomethyl ether acetate. The system was then purged with nitrogen. The mixture was subsequently heated to 80° C. and reacted for 1 hour. The reaction solution was cooled to room temperature, and then filtered through a PTFE microfilter having a pore size of 1.0 μm to prepare a resin composition containing 20% by mass of an aromatic polyether having the side chain structure of formula (22) above. The amino group conversion of the resulting aromatic polyether was 95%.

Example 7

In a three-necked flask equipped with a stirrer, a thermometer, and a Dimroth condenser, 3.00 g of the aromatic polyether obtained in Synthesis Example 1 and 1.58 g of 1,1-cyclohexanediacetic anhydride were dissolved in 18.32 g of a mixed solution of propylene glycol monomethyl ether acetate and N,N-2-trimethylpropionamide at a mass ratio of 1:1. The system was then purged with nitrogen. The mixture was subsequently heated to 80° C. and reacted for 1 hour. The reaction solution was cooled to room temperature, and then filtered through a PTFE microfilter having a pore size of 1.0 μm to prepare a resin composition containing 20% by mass of an aromatic polyether having a side chain structure of the following formula (26). The amino group conversion of the resulting aromatic polyether was 89%.

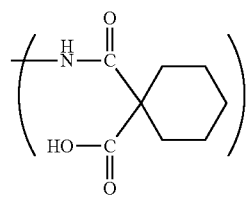
(26)

Comparative Example 1

In 20.00 g of propylene glycol monomethyl ether acetate, 5.00 g of the aromatic polyether obtained in Comparative Synthesis Example 1 was dissolved, and the solution was filtered through a PTFE microfilter with a pore size of 1.0 μm to prepare a resin composition having a resin solids content of 20% by mass.

Comparative Example 2

In 20.00 g of propylene glycol monomethyl ether acetate, 5.00 g of the aromatic polyether obtained in Comparative Synthesis Example 2 was dissolved, and the solution was filtered through a PTFE microfilter with a pore size of 1.0 μm to prepare a resin composition having a resin solids content of 20% by mass.

Comparative Example 3

In 20.00 g of N,N,2-trimethylpropionamide, 5.00 g of the polyimide precursor obtained in Comparative Synthesis Example 3 was dissolved, and the solution was filtered through a PTFE microfilter with a pore size of 1.0 μm to prepare a resin composition having a resin solids content of 20% by mass.

Comparative Example 4

In 20.00 g of propylene glycol monomethyl ether acetate, 5.00 g of the aromatic polyether obtained in Comparative Synthesis Example 4 was dissolved, and the solution was filtered through a PTFE microfilter with a pore size of 1.0 μm to prepare a resin composition having a resin solids content of 20% by mass.

[Solubility in Aqueous Alkaline Solution]

The resin composition obtained in each of Examples 1 to 7 and Comparative Examples 1 to 4 was applied onto a silicon wafer with a spin coater, and then baked on a hot plate at 100° C. for 2 minutes to form a film with a film thickness of 1.0 μm. The film was immersed in a 2.38% by mass aqueous solution of tetramethylammonium hydroxide (hereinafter abbreviated to TMAH) for 1 minute, and then washed with pure water. The film was then baked on a hot plate at 100° C. for 1 minute. The remaining film thickness was subsequently measured to evaluate the solubility in the aqueous alkaline solution. The results are shown in Table 1. The remaining film ratio was calculated based on the following equation. A remaining film ratio of less than 1% is denoted by ○, and a remaining film ratio of 1% or more is denoted by ×.

{(Film Thickness before Immersion)−(Remaining Film Thickness after Immersion)}÷(Film Thickness before Immersion)×100

[Evaluation of Electrical Insulating Properties]

Propylene glycol monomethyl ether acetate was added to the resin composition obtained in each of Examples 1 to 7 and Comparative Examples 1 to 4 to prepare a diluted solution so that when a film was formed on a silicon wafer with a spin coater, the film thickness would become 500 nm. The prepared diluted solution was applied onto a silicon wafer with a spin coater, baked on a hot plate at 100° C. for 2 minutes, and further baked in a nitrogen-purged oven at 250° C. for 1 hour to form a film. For evaluation of the insulating properties of the film, leakage current values upon application of voltages of 1 MV/cm, 2 MV/cm, and 3 MV/cm were measured with a mercury probe (CVmap92-B from Four Dimensions Inc.). The results are shown in Table 1. A leakage current value of less than $1.0 \times 10^{-9}$ A/cm$^2$ is denoted by ⊚, a leakage current value of $1.0 \times 10^{-9}$ A/cm$^2$ or more and less than $1.0 \times 10^{-8}$ A/cm$^2$ is denoted by ○, a leakage current value of $1.0 \times 10^{-8}$ A/cm$^2$ or more and less than $1.0 \times 10^{-7}$ A/cm$^2$ is denoted by Δ, and a leakage current value of $1.0 \times 10^{-7}$ or more is denoted by ×.

TABLE 1

| | Solubility in Aqueous Alkaline Solution | Electrical Insulating Properties | | |
|---|---|---|---|---|
| | | 1 MV/cm | 2 MV/cm | 3 MV/cm |
| Example 1 | ○ | ○ | ○ | Δ |
| Example 2 | ○ | ⊚ | ○ | ○ |
| Example 3 | ○ | ○ | ○ | Δ |
| Example 4 | ○ | ⊚ | ○ | ○ |
| Example 5 | ○ | ⊚ | ○ | ○ |
| Example 6 | ○ | ⊚ | ○ | ○ |
| Example 7 | ○ | ⊚ | ○ | ○ |
| Comparative Example 1 | X | ⊚ | ⊚ | ○ |
| Comparative Example 2 | ○ | ○ | X | X |
| Comparative Example 3 | ○ | ○ | Δ | X |
| Comparative Example 4 | X | ⊚ | ○ | ○ |

As evident from the results shown in Table 1, all the films formed using the resin compositions of Examples 1 to 7 had high solubility in the aqueous alkaline solution, and the films formed using the resin compositions of Examples 1 to 7 had excellent electrical insulating properties. On the other hand, the aromatic polyether contained in the resin composition of Comparative Example 1 had no solubility in the aqueous alkaline solution, although it had excellent electrical insulating properties. The aromatic polyether having an acidic group contained in the resin composition of Comparative Example 2 had poor electrical insulating properties, although it had good solubility in the aqueous alkaline solution. The polyimide precursor contained in the resin composition of Comparative Example 3 was not provided with sufficient electrical characteristics by baking at 250° C., although it had good solubility in the aqueous alkaline solution. The aromatic polyether contained in the resin composition of Comparative Example 4 had remarkably poor solubility in the aqueous alkaline solution, because the hydrolysis or imidization of amic acid proceeded due to the exposure to a high temperature for a long time during the polymer synthesis.

Preparation of Negative Photosensitive Resin Composition

Example 8

In a three-necked flask equipped with a stirrer, a thermometer, and a Dimroth condenser, 15.00 g of the aromatic polyether obtained in Synthesis Example 1, 1.64 g of itaconic anhydride, and 5.74 g of 4-methylcyclohexane-1,2-dicarboxylic anhydride were dissolved in 52.22 g of propylene glycol-1-monomethyl ether-2-acetate. The system was then purged with nitrogen. The mixture was subsequently heated to 80° C. and reacted for 1 hour to prepare a resin composition containing 30% by mass of an aromatic polyether having a structural unit with the side chain structure of formula (21) above and a structural unit with the side chain structure of formula (23) above, in which the molar ratio of the former structural unit to the latter structural unit is 30:70. The amino group conversion of the resulting aromatic polyether was 95%. To 60.00 g of the resulting resin composition were added 5.40 g of A-DPH (from Shin-Nakamura Chemical Co., Ltd.) as a radical crosslinking agent, 0.90 g of Karenz MT-PE1 (from Showa Denko K.K.) as a chain transfer agent, 0.90 g of IRGACURE OXE01 as a photoradical generator, 3.60 g of VESTANAT B1358/100 (from Evonik Industries Ltd.) as a thermosetting crosslinking agent, and 1.20 g of propylene glycol monomethyl ether acetate as a viscosity modifier, and the mixture was stirred to homogeneity. The resulting mixture was then filtered through a PTFE microfilter with a pore size of 5.0 μm to prepare a negative photosensitive resin composition.

[Solubility of Film Before Exposure in Aqueous Alkaline Solution]

The photosensitive resin composition obtained in Example 8 was applied onto a silicon wafer with a spin coater, and then baked on a hot plate at 100° C. for 2 minutes to form a film with a film thickness of 6 μm. The film was immersed in a 2.38% by mass aqueous solution of TMAH for 60 seconds, and then washed with pure water for 30 seconds. The film was then baked on a hot plate at 100° C. for 1 minute. The remaining film thickness was subsequently measured to evaluate the solubility in the aqueous alkaline solution. The results are shown in Table 2. The remaining film ratio was calculated based on the equation shown above. A remaining film ratio of less than 1% is denoted by ○, and a remaining film ratio of 1% or more is denoted by ×.

[Solubility of Film after Exposure in Aqueous Alkaline Solution]

The photosensitive resin composition obtained in Example 8 was applied onto a silicon wafer with a spin coater, and then baked on a hot plate at 100° C. for 2 minutes to form a film with a film thickness of 6 μm. The film was irradiated with 100 mJ/cm$^2$ (illuminance: 4.6 mW/cm$^2$) of i-line (365 nm), using a high-pressure mercury lamp, and then baked on a hot plate at 130° C. for 2 minutes. The film was subsequently immersed in a 2.38% by mass aqueous solution of TMAH for 60 seconds, and further washed with pure water for 30 seconds. The film was then baked on a hot plate at 100° C. for 1 minute. Pattern formability was evaluated based on the remaining film ratios before and after the immersion in the 2.38% by mass aqueous solution of TMAH. The results are shown in Table 2. A remaining film ratio of 90% or more is denoted by ○, and a remaining film ratio of less than 90% is denoted by ×.

[Resolution]

The photosensitive resin composition obtained in Example 8 was applied onto a silicon wafer with a spin coater, and then baked on a hot plate at 100° C. for 2 minutes to form a film with a film thickness of 6 μm. The film was irradiated with 100 mJ/cm$^2$ (illuminance: 4.6 mW/cm$^2$) of i-line (365 nm) through a quartz mask, using a high-pressure mercury lamp, and then baked on a hot plate at 130° C. for 2 minutes. The film was subsequently subjected to paddle development in a 2.38% by mass aqueous solution of TMAH for 60 seconds to dissolve unexposed portions, and further washed with pure water for 30 seconds. The film was then baked on a hot plate at 100° C. for 1 minute. For evaluation of the resolution, a case where a hole pattern with a diameter of 10 μm was resolved on the silicon wafer is denoted by ○, and a case where such a hole pattern was not resolved is denoted by ×. The results are shown in Table 2.

[Solvent Resistance]

The photosensitive resin composition obtained in Example 8 was applied onto a silicon wafer with a spin coater, and then baked on a hot plate at 100° C. for 2 minutes. The resulting product was irradiated with 100 mJ/cm$^2$ (illuminance: 4.6 mW/cm$^2$) of i-line (365 nm), using a high-pressure mercury lamp, and then baked on a hot plate at 130° C. for 2 minutes. The resulting product was subsequently baked in a nitrogen-purged oven at 250° C. for 1 hour to form a film with a film thickness of 5 μm. The solvent resistance of the formed film was evaluated based on the remaining film ratio after 1 minute of immersion in propylene glycol monomethyl ether (PGME), propylene glycol monomethyl ether acetate (PGMEA), cyclohexanone (CYH), or N-methyl-2-pyrrolidinone (NMP) at 23° C. The results are shown in Table 2. The remaining film ratio was calculated based on the equation shown above. A remaining film ratio of 90% or more is denoted by ○, and a remaining film ratio of less than 90% is denoted by ×.

[Evaluation of Electrical Insulating Properties]

The photosensitive resin composition obtained in Example 8 was diluted with propylene glycol monomethyl ether acetate so that when a film was formed, the film thickness would become 500 nm. The diluted solution was applied onto a silicon wafer with a spin coater, and then baked on a hot plate at 100° C. for 2 minutes. The resulting product was irradiated with 100 mJ/cm$^2$ (illuminance: 4.6 mW/cm$^2$) of i-line (365 nm), using a high-pressure mercury lamp, and then baked on a hot plate at 130° C. for 2 minutes. The resulting product was subsequently baked in a nitrogen-purged oven at 250° C. for 1 hour to form a film. For evaluation of the insulating properties of the film, leakage current values upon application of voltages of 1 MV/cm, 2 MV/cm, and 3 MV/cm were measured with a mercury probe (CVmap92-B from Four Dimensions Inc.). A leakage current value of less than $1.0 \times 10^{-9}$ A/cm$^2$ is denoted by ⊚, a leakage current value of $1.0 \times 10^{-9}$ A/cm$^2$ or more and less than $1.0 \times 10^{-8}$ A/cm$^2$ is denoted by ○, a leakage current value of $1.0 \times 10^{-8}$ A/cm$^2$ or more and less than $1.0 \times 10^{-7}$ A/cm$^2$ is denoted by Δ, and a leakage current value of $1.0 \times 10^{-7}$ or more is denoted by ×. The results are shown in Table 3.

Preparation of Positive Photosensitive Resin Composition

Example 9

In a three-necked flask equipped with a stirrer, a thermometer, and a Dimroth condenser, 10.00 g of the aromatic polyether obtained in Synthesis Example 1 and 5.39 g of 4-methylcyclohexane-1,2-dicarboxylic anhydride were dissolved in 28.58 g of propylene glycol monomethyl ether acetate. The system was then purged with nitrogen. The mixture was subsequently heated to 80° C. and reacted for 1 hour. The reaction solution was cooled to room temperature, and then filtered through a PTFE microfilter having a pore size of 1.0 μm to prepare a resin composition containing 35% by mass of an aromatic polyether having the side chain structure of formula (25) above. The amino group conversion of the resulting aromatic polyether was 95%. To 30.00 g of the resulting resin composition, 1.58 g of a photoacid generator of the following formula (27), wherein D is a group of the following formula (28) or a hydrogen atom, 2.10 g of VESTANAT B1358/100 (from Evonik Industries Ltd.) as a thermosetting crosslinking agent, and 1.77 g of propylene glycol monomethyl ether acetate as a viscosity modifier were added, and the mixture was stirred to homogeneity. The resulting mixture was then filtered through a PTFE microfilter with a pore size of 5.0 μm to prepare a positive photosensitive resin composition.

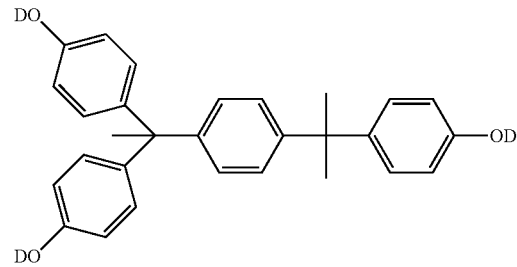

(27)

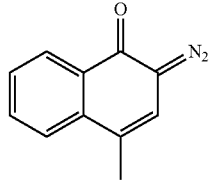

(28)

Example 10

In a three-necked flask equipped with a stirrer, a thermometer, and a Dimroth condenser, 30.00 g of the aromatic polyether obtained in Synthesis Example 1 and 15.79 g of 1,1-cyclohexanediacetic anhydride were dissolved in 85.04 g of a mixed solution of propylene glycol monomethyl ether acetate and N,N-2-trimethylpropionamide at a mass ratio of 1:1. The system was then purged with nitrogen. The mixture was subsequently heated to 80° C. and reacted for 1 hour. The reaction solution was cooled to room temperature, and then filtered through a PTFE microfilter having a pore size of 1.0 μm to prepare a resin composition containing 35% by mass of an aromatic polyether having the side chain structure of formula (26) above. The amino group conversion of the resulting aromatic polyether was 89%. To 30.00 g of the resulting resin composition, 2.10 g of the photoacid generator of formula (27) above, wherein D is the group of formula (28) above or a hydrogen atom, 4.20 g of VESTANAT B1358/100 (from Evonik Industries Ltd.) as a thermosetting crosslinking agent, 1.05 g of TRIXENEBI-7992 (from Baxenden Ltd.), 0.21 g of 1,8-diazabicyclo[5.4.0]-7-undecene as a catalyst, 0.05 g of MEGAFACE (registered trademark) R-30-N (from DIC Corporation) as a surfactant, 0.11 g of 3-phenylaminopropyltrimethoxysilane as a silane coupling agent, 0.32 g of maleic acid as a pH adjuster, and 8.22 g of a mixed solution of propylene glycol monomethyl ether acetate and N,N-2-trimethylpropionamide at a mass ratio of 1:1 as a viscosity modifier were added, and the mixture was stirred to homogeneity. The resulting mixture was then filtered through a PTFE microfilter with a pore size of 5.0 μm to prepare a positive photosensitive resin composition.

Comparative Example 5

To 20.25 g of propylene glycol monomethyl ether acetate, 10.00 g of the aromatic polyether obtained in Comparative Synthesis Example 4, 2.00 g of the photoacid generator of formula (27) above, wherein D is the group of formula (28) above or a hydrogen atom, and 1.50 g of VESTANAT B1358/100 (from Evonik Industries Ltd.) as a thermosetting crosslinking agent were added, and the mixture was stirred to homogeneity. The resulting mixture was then filtered through a PTFE microfilter with a pore size of 5.0 μm to prepare a positive photosensitive resin composition.

[Solubility of Film Before Exposure in Aqueous Alkaline Solution]

The photosensitive resin composition obtained in each of Examples 9 and 10, and Comparative Example 5 was applied onto a silicon wafer with a spin coater, and then baked on a hot plate at 100° C. for 2 minutes to form a film with a film thickness of 6 μm. The film was immersed in a 2.38% by mass aqueous solution of TMAH for 60 seconds, and then washed with pure water for 30 seconds. The film was then baked on a hot plate at 100° C. for 1 minute. The remaining film thickness was subsequently measured to evaluate the solubility in the aqueous alkaline solution. The remaining film ratio was calculated based on the equation shown above. A remaining film ratio of 90% or more is denoted by ○, and a remaining film ratio of less than 90% is denoted by ×. The results are shown in Table 2.

[Solubility of Film after Exposure in Aqueous Alkaline Solution]

The photosensitive resin composition obtained in each of Examples 9 and 10, and Comparative Example 5 was applied onto a silicon wafer with a spin coater, and then baked on a hot plate at 100° C. for 2 minutes to form a film with a film thickness of 6 μm. The film was irradiated with 500 mJ/cm² (illuminance: 4.6 mW/cm²) of i-line (365 nm), using a high-pressure mercury lamp. The film was then immersed in a 2.38% by mass aqueous solution of TMAH for 60 seconds, and further washed with pure water for 30 seconds. The film was then baked on a hot plate at 100° C. for 1 minute. Pattern formability was evaluated based on the remaining film ratios before and after the immersion in the 2.38% by mass aqueous solution of TMAH. A remaining film ratio of less than 1% is denoted by ○, and a remaining film ratio of 1% or more is denoted by ×. The results are shown in Table 2.

[Resolution]

The photosensitive resin composition obtained in each of Examples 9 and 10, and Comparative Example 5 was applied onto a silicon wafer with a spin coater, and then baked on a hot plate at 100° C. for 2 minutes to form a film with a film thickness of 6 μm. The film was irradiated with 500 mJ/cm² (illuminance: 4.6 mW/cm²) of i-line (365 nm) through a quartz mask, using a high-pressure mercury lamp. The film was then subjected to paddle development in a 2.38% by mass aqueous solution of TMAH for 60 seconds to dissolve unexposed portions, and further washed with pure water for 30 seconds. The film was then baked on a hot plate at 200° C. for 1 minute. For evaluation of the resolution, a case where a 10-μm hole pattern was resolved on the silicon wafer is denoted by ○, and a case where such a hole pattern was not resolved is denoted by ×. The results are shown in Table 2.

[Solvent Resistance]

The photosensitive resin composition obtained in each of Examples 9 and 10, and Comparative Example 5 was applied onto a silicon wafer with a spin coater, and then baked on a hot plate at 100° C. for 2 minutes. The resulting product was subsequently baked in a nitrogen-purged oven at 250° C. for 1 hour to form a film with a film thickness of 5 μm. The solvent resistance of the formed film was evaluated based on the remaining film ratio after 1 minute of immersion in propylene glycol monomethyl ether (PGME), propylene glycol monomethyl ether acetate (PGMEA), cyclohexanone (CYH), or N-methyl-2-pyrrolidinone (NMP) at 23° C. The remaining film ratio was calculated based on the equation shown above. A remaining film ratio of 90% or more is denoted by ○, and a remaining film ratio of less than 90% is denoted by ×. The results are shown in Table 2.

[Evaluation of Electrical Insulating Properties]

The photosensitive resin composition obtained in each of Examples 9 and 10, and Comparative Example 5 was diluted with propylene glycol monomethyl ether acetate so that when a film was formed, the film thickness would become 500 nm. The diluted solution was applied onto a silicon wafer with a spin coater, and then baked on a hot plate at 100° C. for 2 minutes. The resulting product was subsequently baked in a nitrogen-purged oven at 250° C. for 1 hour to form a film. For evaluation of the insulating properties of the film, leakage current values upon application of voltages of 1 MV/cm, 2 MV/cm, and 3 MV/cm were measured with a mercury probe (CVmap92-B from Four Dimensions Inc.). A leakage current value of less than $1.0 \times 10^{-9}$ A/cm² is denoted by ⊚, a leakage current value of $1.0 \times 10^{-9}$ A/cm² or more and less than $1.0 \times 10^{-8}$ A/cm² is denoted by ○, a leakage current value of $1.0 \times 10^{-8}$ A/cm² or more and less than $1.0 \times 10^{-7}$ A/cm² is denoted by Δ, and a leakage current value of $1.0 \times 10^{-7}$ or more is denoted by ×. The results are shown in Table 3.

TABLE 2

|  | Solubility in Aqueous Alkaline Solution | | Resolution | Solvent Resistance | | | |
|---|---|---|---|---|---|---|---|
|  | before Exposure | after Exposure | | PGME | PGMEA | CYH | NMP |
| Example 8 | ○ | ○ | ○ | ○ | ○ | ○ | ○ |
| Example 9 | ○ | ○ | ○ | ○ | ○ | ○ | ○ |

TABLE 2-continued

| | Solubility in Aqueous Alkaline Solution | | | Solvent Resistance | | | |
|---|---|---|---|---|---|---|---|
| | before Exposure | after Exposure | Resolution | PGME | PGMEA | CYH | NMP |
| Example 10 | ○ | ○ | ○ | ○ | ○ | ○ | ○ |
| Comparative Example 5 | ○ | X | X | ○ | ○ | ○ | ○ |

TABLE 3

| | Electrical Insulating Properties | | |
|---|---|---|---|
| | 1 MV/cm | 2 MV/cm | 3 MV/cm |
| Example 8 | ◉ | ○ | ○ |
| Example 9 | ◉ | ◉ | ○ |
| Example 10 | ◉ | ◉ | ○ |
| Comparative Example 5 | ◉ | ◉ | ○ |

As evident from the results shown in Tables 2 and 3, patterns with good resolution could be formed on the films formed using the photosensitive resin compositions of Examples 8 to 10, using the aqueous alkaline solution as the developing solution. The films formed using the photosensitive resin compositions of Examples 8 to 10 also had excellent solvent resistance and electrical insulating properties through baking at 250° C.

The invention claimed is:

1. A resin composition for forming an insulating film comprising:
a polymer having a structural unit of the following formula (1a) and a structural unit of the following formula (1b); and
an organic solvent:

  (1a)

  (1b)

wherein
T$_0$ is a divalent organic group containing at least one arylene group in which at least one hydrogen atom is substituted with an amino group; and
T$_1$ is a divalent organic group containing at least one arylene group having at least one substituent, wherein the substituent is a substituent of the following formula (2):

  (2)

wherein Z is a divalent group of the following formula (3), (4), (5), or (6):

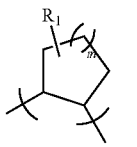  (3)

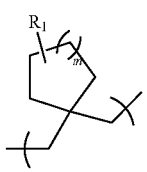  (4)

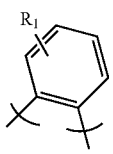  (5)

  (6)

wherein
m is 1 or 2;
R$_1$ is a hydrogen atom, a C$_{1-18}$ alkyl group, a hydroxy group, a carboxy group, or an alkoxysilyl group;
n is 0 or 1;
R$_2$ is a hydrogen atom, a C$_{1-18}$ alkyl group, a vinyl group, an allyl group, a 2-buten-1-yl group, a 2-methyl-2-propenyl group, a 1-propenyl group, or an alkoxysilyl group, wherein the alkyl group optionally has an alkoxysilyl group as a substituent; and
R$_3$ is a methylene group, an ethylene group, an ethene-1,2-diyl group, or a vinylidene group.

2. The resin composition for forming an insulating film according to claim 1, wherein the polymer further contains a structural unit of the following formula (7):

  (7)

wherein T$_2$ is a divalent organic group containing at least one arylene group.

3. The resin composition for forming an insulating film according to claim 1, wherein
T$_0$ in the structural unit of formula (1a) above is a divalent organic group of the following formula (11), and
T$_1$ in the structural unit of formula (1b) above is a divalent organic group of the following formula (12):

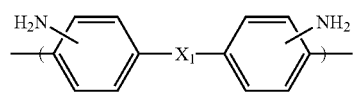

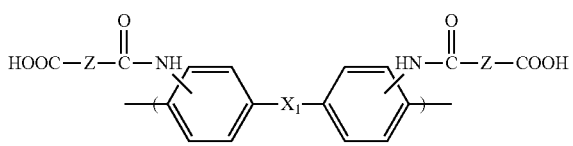

wherein
Z is as defined in formula (2) above; and
X$_1$ is a single bond, a C$_{1-3}$ alkylene group, a C$_{1-3}$ fluoroalkylene group, a phenylene group, an —O— group, a —S— group, a sulfonyl group, a carbonyl group, or a combination of the phenylene group with the C$_{1-3}$ alkylene group, the —O— group, or the —S— group.

4. The resin composition for forming an insulating film according to claim 2, wherein T$_2$ in the structural unit of formula (7) above is a divalent organic group of the following formula (13):

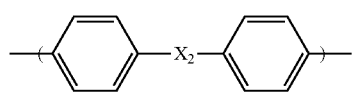

wherein X$_2$ is a single bond, a C$_{1-3}$ alkylene group, a C$_{1-3}$ fluoroalkylene group, a divalent C$_{6-13}$ hydrocarbon group containing a benzene ring or a cyclohexane ring, an —O— group, a —S— group, a sulfonyl group, or a carbonyl group.

5. The resin composition for forming an insulating film according to claim 1, wherein the polymer has a weight average molecular weight of 1,000 to 100,000.

6. The resin composition for forming an insulating film according to claim 1, which further comprises a photosensitizer.

7. The resin composition for forming an insulating film according to claim 6, wherein the photosensitizer is a photoradical generator or a photoacid generator.

8. The resin composition for forming an insulating film according to claim 1, which further comprises a crosslinking agent.

9. The resin composition for forming an insulating film according to claim 8, wherein the crosslinking agent is contained in an amount of 10 to 100 phr relative to the polymer.

10. The resin composition for forming an insulating film according to claim 8, wherein the crosslinking agent is at least one selected from the group consisting of a thermally or acid reactive crosslinking agent and a radical reactive crosslinking agent.

11. A method for forming a pattern comprising the steps of:
applying the resin composition for forming an insulating film according to claim 1 onto a substrate, and drying the resin composition to form a coating film;
exposing the coating film to g-line, h-line, i-line, broadband ghi-line, or a KrF excimer laser; and
developing the exposed film with an aqueous alkaline solution or an organic solvent.

12. A method for synthesizing a polymer having a structural unit of the following formula (1a) and a structural unit of the following formula (1b), wherein a solution obtained by dissolving a polymer having the structural unit of the following formula (1a) and a monomer of the following formula (14) in an organic solvent is heated to react the polymer and the monomer:

$$-\!\!\!-\!\!(T_0\text{-}O)\!\!-\!\!\!-\quad(1a)$$

wherein T$_0$ is a divalent organic group of the following formula (11):

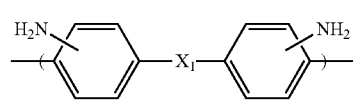

wherein X$_1$ is a single bond, a C$_{1-3}$ alkylene group, a C$_{1-3}$ fluoroalkylene group, a phenylene group, an —O— group, a —S— group, a sulfonyl group, a carbonyl group, or a combination of the phenylene group with the C$_{1-3}$ alkylene group, the —O— group, or the —S— group;

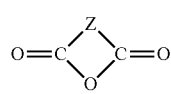

wherein Z is a divalent group of the following formula (3), (4), (5), or (6):

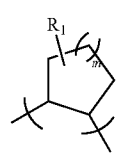

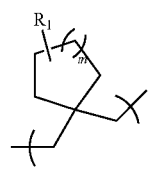

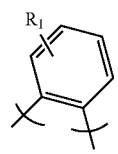

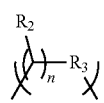

wherein m is 1 or 2; R$_1$ is a hydrogen atom, a C$_{1-18}$ alkyl group, a hydroxy group, a carboxy group, or an alkoxysilyl group; n is 0 or 1; R$_2$ is a hydrogen atom, a C$_{1-18}$ alkyl group, a vinyl group, an allyl group, a 2-buten- 1-yl group, a 2-methyl-2-propenyl group, a 1-propenyl group, or an alkoxysilyl group, wherein the alkyl group optionally has an alkoxysilyl group as a substituent; and $R_3$ is a methylene group, an ethylene group, an ethene-1,2-diyl group, or a vinylidene group;

$-(T_1-O)-$ (1b)

wherein $T_1$ is a divalent organic group of the following formula (12):

(12)

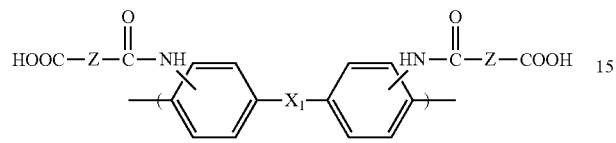

wherein $X_1$ is as defined in formula (11) above; and Z is as defined in formula (14) above.

* * * * *